United States Patent [19]

Hollingsworth et al.

[11] Patent Number: 5,521,428
[45] Date of Patent: May 28, 1996

[54] FLAGLESS SEMICONDUCTOR DEVICE

[75] Inventors: Tom R. Hollingsworth, San Marcos; Michael B. McShane, Austin, both of Tex.

[73] Assignee: Motorola, Inc., Schaumburg, Ill.

[21] Appl. No.: 293,402

[22] Filed: Aug. 22, 1994

Related U.S. Application Data

[63] Continuation of Ser. No. 34,961, Mar. 22, 1993, abandoned.

[51] Int. Cl.⁶ .................................................. H01L 23/495
[52] U.S. Cl. ........................ 257/670; 257/669; 257/674; 257/676
[58] Field of Search ........................... 257/666, 670, 257/674, 678, 676, 690, 669, 675, 792, 796

[56] References Cited

U.S. PATENT DOCUMENTS

| | | | |
|---|---|---|---|
| 3,708,730 | 1/1973 | Schierz et al. | 257/670 |
| 4,307,297 | 12/1981 | Groff et al. | 257/666 |
| 4,612,564 | 9/1986 | Moyer | 357/70 |
| 4,766,478 | 8/1988 | Dennis | 357/70 |
| 4,829,362 | 5/1989 | Tran et al. | 357/70 |
| 4,868,635 | 9/1989 | Frechette et al. | 357/70 |
| 4,924,291 | 5/1990 | Lesk et al. | 257/669 |
| 4,949,160 | 8/1990 | Ohno | 357/70 |
| 4,994,895 | 2/1991 | Matsuzaki et al. | 357/72 |
| 5,021,864 | 6/1991 | Kelly et al. | 257/676 |
| 5,021,865 | 6/1991 | Takahashi et al. | 257/676 |
| 5,161,304 | 11/1992 | Queyssac et al. | 29/827 |

FOREIGN PATENT DOCUMENTS

| | | | |
|---|---|---|---|
| 60-42852 | 3/1985 | Japan | 257/670 |
| 63-40352 | 2/1988 | Japan | 257/676 |
| 64-80051 | 3/1989 | Japan | H01L 23/50 |
| 2273961 | 1/1991 | Japan | 257/666 |
| 3139811 | 9/1991 | Japan | 257/666 |
| 4-15947 | 1/1992 | Japan | H01L 23/50 |

*Primary Examiner*—Rolf Hille
*Assistant Examiner*—David Ostrowski
*Attorney, Agent, or Firm*—Patricia S. Goddard

[57] ABSTRACT

A flagless semiconductor device (10) includes a semiconductor die (22) having a plurality of bond pads (26) which are electrically coupled to a plurality of leads (16) by wire bonds (28). The die is supported by two cantilevered tie bars (18). Use of cantilevered tie bars decreases the total plastic-metal interface area in a plastic encapsulated device, thereby lessening the probability of internal delamination and package cracking. The cantilevered tie bars also permit a variety of die sizes to be used with the same lead frame design. Suitable configurations for cantilevered tie bars include, but are not limited to, U-shape, T-shape, and H-shape configurations.

22 Claims, 2 Drawing Sheets

FLAGLESS SEMICONDUCTOR DEVICE

This application is a continuation of prior application Ser. No. 08/034,961, filed Mar. 22, 1993, entitled "FLAGLESS SEMICONDUCTOR DEVICE AND METHOD FOR MAKING THE SAME" now abandoned.

CROSS-REFERENCE TO RELATED APPLICATION

The present application is related to a commonly assigned, co-pending patent application entitled "Semiconductor Device Having Universal Low-Stress Die Support and Method for Making the Same," by Frank Djennas et al., Ser. No. 08/035,422, filed Mar. 22, 1993.

FIELD OF THE INVENTION

The present invention relates generally to semiconductor devices, and more specifically to flagless semiconductor devices and methods for making the same.

BACKGROUND OF THE INVENTION

Package cracking is a common problem in plastic encapsulated semiconductor devices. The problem arises from a combination of factors. One factor is an internal delamination between the plastic encapsulant material and a flag of a lead frame. The flag is a plate-like member of a conventional lead frame which supports the die. The flag, like the rest of the lead frame, is usually made of copper, a copper-alloy, or an iron-nickel alloy, and therefore has a coefficient of thermal expansion (CTE) which in most instances is different than that of the surrounding molding compound or plastic. As a result of this CTE mismatch, stress is created at the plastic-flag interface as the semiconductor device experiences temperature changes. The stress, upon reaching a maximum threshold, is relieved through delamination of the plastic-flag interface. Another factor involved in package cracking is moisture absorption. After the plastic-flag interface becomes delaminated, moisture from the environment diffuses through the molding compound to the delaminated area. Once moisture accumulates in the package, rapid temperature increases will cause the moisture to vaporize and expand, thereby creating an internal pressure pocket in the delaminated area. To relieve the pressure and associated stress, the surrounding plastic cracks. The most common occurrence of package cracking occurs when a user attaches a plastic semiconductor device to a substrate using a solder reflow operation. The high temperatures associated with solder reflow induce a rapid temperature increase which is often sufficient, depending on the moisture content of the device, to cause the plastic to crack.

There are numerous existing methods of dealing with the problem of package cracking. One method is dry-packing, which involves baking plastic encapsulated semiconductor devices sufficiently to reduce moisture content and packaging the devices into moisture resistant packets. Device users then attach the device before a sufficient amount of moisture to cause cracking can be absorbed into the package through exposure to ambient conditions. This method is effective, but significantly increases the costs of semiconductor devices. Moreover, device users must keep track of how long devices have been exposed to the ambient conditions to assure that any absorbed moisture is insufficient to cause cracking problems.

Other known approaches have tried to decrease the possibility of internal delamination through improved adhesion between flag and the plastic. For example, some manufacturers have "roughened" the metallic surface of the flag to improve adhesion. Others have formed small holes or dimples in the flag to provide anchoring mechanism. Another approach used to improve adhesion is use of a window-frame flag. A window-frame flag is more or less a hollowed-frame that supports the die, rather than a solid paddle.

The methods described above do, to some extent, decrease the possibility of delamination by providing better adhesion to the plastic encapsulating material. Similarly, the present invention has the advantage of reduced delamination, albeit through a technique not previously used. But in addition, the present invention addresses another manufacturing problem which the above methods do not address, namely the need for semiconductor manufacturers to use a different or customized lead frame design for each of its products. Having a different lead frame design for each die size and die functional pin-out necessitates a large inventory of piece-parts and requires additional time and human resources to design a new lead frame before each product introduction. In addition to costs associated with inventory and design, the cost of the lead frames themselves are undesirably inflated because of insufficient volume to lower the cost to a minimum. Several small orders for lead frames, each requiring separate tooling, is more costly than one order for the same total number of lead frames. Thus, the cost of semiconductor manufacturing could be significantly reduced by the use of a lead frame design which could be used in conjunction with several different die sizes. The present invention achieves this goal by utilizing a lead frame in a semiconductor device which can be used with various die sizes, while at the same time improving adhesion between the lead frame and the encapsulating material to alleviate package cracking problems.

SUMMARY OF THE INVENTION

In one form of the invention, a semiconductor device has a lead frame comprised of a plurality of leads and two cantilevered tie bars. The plurality of leads has inner portions which define a die receiving area. The two tie bars extend from two opposing sides of the die receiving area. A semiconductor die is attached to and supported by the tie bars. The die is also electrically coupled to the plurality of leads. A package body encapsulates the semiconductor die. Also within the scope of the invention are methods for making this and other such semiconductor devices.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
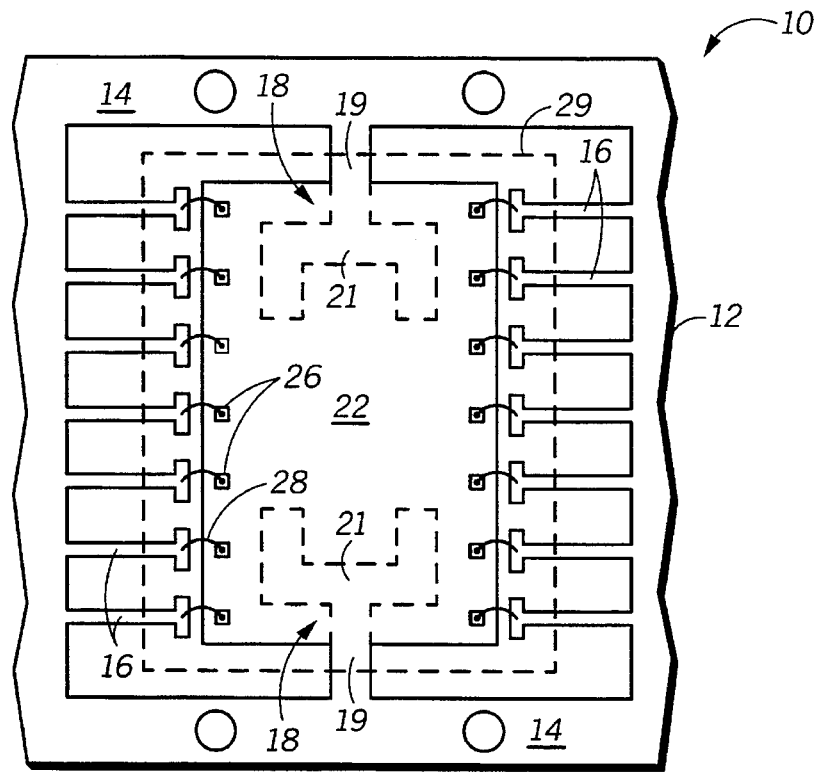
FIG. 1 is a top-down plan view of a partially assembled, flagless semiconductor device in accordance with the present invention.
Figure 2:
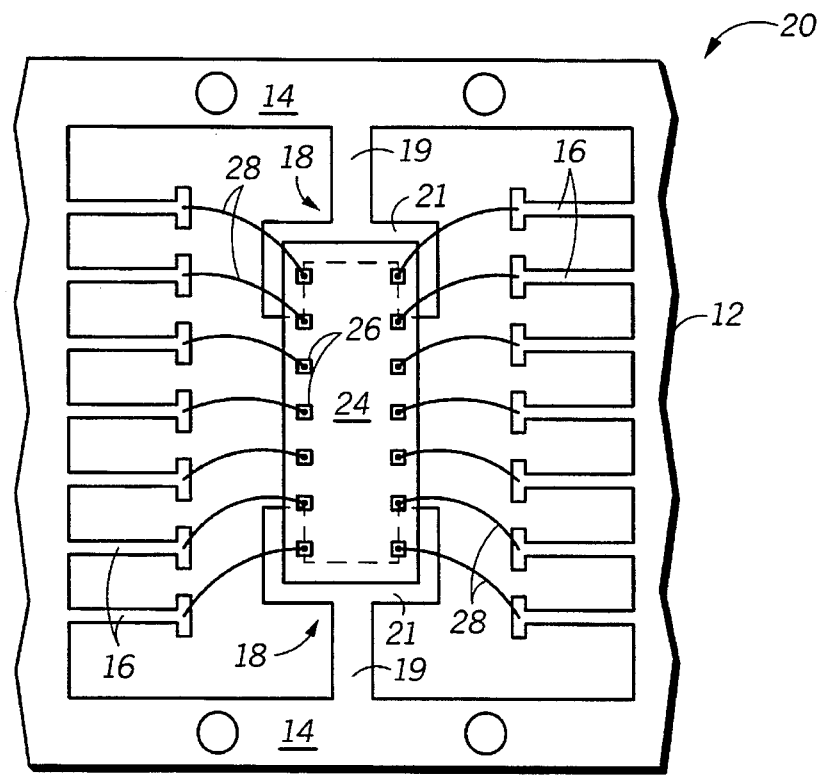
FIG. 2 is a top-down plan view of another partially assembled, flagless semiconductor device in accordance with the present invention which utilizes the same lead frame design as that in FIG. 1.

The present invention is able to reduce the likelihood of internal package delamination, while at the same time creating a universal design which can be used with several different dies sizes, by utilizing cantilevered tie bars to support a semiconductor die. FIGS. 1 and 2 illustrate both the universal aspect of a lead frame used in accordance with the present invention and the nature in which tie bars, rather than a flag, are used to support a semiconductor die. Both figures are a top-down, partial view of a semiconductor device in accordance with the present invention. A semiconductor device 10 is illustrated in FIG. 1 and a semiconductor device 20 is illustrated in FIG. 2. Both devices 10 and 20 include a lead frame 12 having two opposing rails 14, a plurality of leads 16, and two cantilevered tie bars 18. A semiconductor die 22 and a semiconductor die 24 are attached to tie bars 18 in FIG. 1 and FIG. 2, respectively. Each die includes a plurality of conductive bond pads 26 which are electrically coupled to leads 16 in a conventional manner using a plurality of wire bonds 28.

It is important to note that as illustrated in FIGS. 1 and 2 that the semiconductor devices are only partially assembled. The devices are not yet encapsulated in a plastic package body. As one of ordinary skill in the art would recognized, devices 10 and 20 are subsequently encapsulated in a plastic encapsulating material and then excised from lead frame 12 to form completed devices. As a result of being excised, tie bars 18 are no longer joined to rails 14 but are instead severed and flush with an edge of the package body, outlined in FIG. 1 by dashed line 29. Leads 16 are severed and subsequently formed into one of several external lead configurations, such as gull-wing, J-lead, or through-hole configurations.

Lead frame 12 is formed of a common lead frame material, such as copper, a copper-alloy, an iron-nickel alloy, or the like, and is manufactured using conventional processes, for example by metal etching or stamping. Unlike conventional lead flames, lead frame 12 is flagless. Traditionally, a plate-like member called a flag or paddle is connected to tie bars to provide a mounting area for a semiconductor die. In accordance with the present invention, a flag is not used. Instead, cantilevered tie bars are used to support the die. For example, in device 10 of FIG. 1 tie bars 18 support a semiconductor die 22, while in device 20 of FIG. 2 tie bars 18 support a semiconductor die 24. Tie bars 18 each include a stem portion 19 and a support portion 21. As illustrated in FIG. 1, die 22 completely overhangs or covers support portions 21 of tie bars 18. However, as illustrated in FIG. 2, a die support may extend beyond the perimeter of the die such that not all portions of the support portions underlie the die.

In utilizing tie bars as a die support rather than a flag, the total plastic-metal interface area, once the device is encapsulated in plastic, is reduced. For purposes of describing the present invention, the phrase plastic-metal interface is used rather than plastic-flag interface since embodiments of the present invention do not have conventional flags. As a consequence of reducing the plastic-metal interface area, the area in which plastic is directly in contact with the semiconductor die is increased. Together, the reduction in plastic-metal interface area and the increase in plastic-die interface area reduces the chances of internal delamination because most plastic encapsulating materials will adhere to the die better than to a metal surface. Furthermore, if delamination happens to occur at the interface between one of the tie bars and the encapsulating plastic, the interface of the other tie bar with the plastic is unaffected.

The universal nature of lead frame 12 is apparent through a comparison of FIGS. 1 and 2. The same lead frame is used in both figures, yet two different die sizes are used. As illustrated, die 22 is much larger than die 24. Because a flag is not used, a new lead frame need not be designed for use with two different device sizes. In conventional semiconductor devices, a flag used to support a semiconductor die is made the same shape as the die only slightly larger. The purpose of utilizing a flag is to support the die during assembly operations, primarily the step of wire bonding, and during general handling of the device up to the point of encapsulation. Once the die is encapsulated in plastic, a die support member is no longer necessary. One purpose for making the flag larger than the die is to permit visual inspection of the bond between the die and the flag. The semiconductor die is usually attached to the flag using an epoxy. Upon pressing the die against an epoxy covered flag, the epoxy is squeezed from beneath the die to form an epoxy fillet around the die perimeter. The quality of the die-to-flag bond can be evaluated through visual examination of the fillet. If the fillet is continuous, the bond is considered sufficient.

Figure 3:
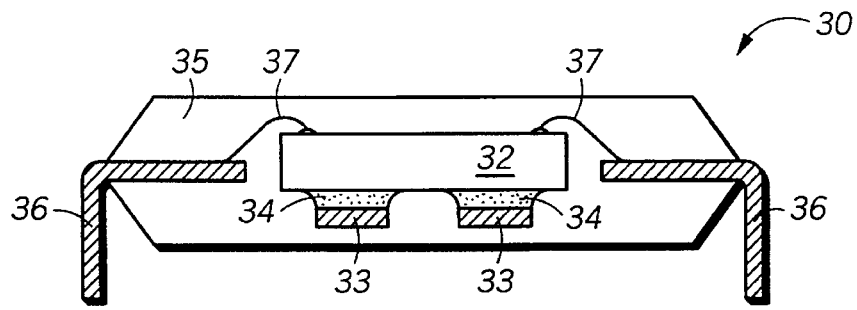
FIG. 3 is a cross-sectional view of a fully assembled semiconductor device in accordance with the present invention.

In accordance with the present invention, a die attach epoxy is dispensed onto those portions of the cantilevered tie bars which will support the die. For example, in FIG. 1 epoxy would be dispensed on the portions of tie bars 18 illustrated by a dashed line. Upon pressing the die against the tie bars to effect the bond, epoxy will be squeezed outward to form a fillet along the perimeter of the tie bars, not around the perimeter of die. This "inverted" fillet is illustrated in a cross-sectional perspective in a semiconductor device 30 of FIG. 3. Device 30 includes a semiconductor die 32 attached to a cantilevered tie bar 33. The device is encapsulated in a plastic package 35, and the die is electrically coupled to a plurality of leads 36 by wire bonds 37. Leads 36 are as illustrated in a through-hole configuration, although J-lead and gull-wing configurations may be used. As illustrated, it appears as though die 32 is attached to two tie bars, but really the cross-section is taken through a forked portion of a tie bar, for example through the U-shaped portion of tie bar 18 in FIGS. 1 and 2. Die 32 is bonded to the tie bars by a conventional die attach adhesive 34, such as an epoxy. When the semiconductor die completely overhangs the tie bars, as in devices 10 and 30, the epoxy should form an inverted fillet as illustrated in FIG. 3. Like in conventional devices, a bond can be evaluated by the continuity of the epoxy fillet. However, inspection of an inverted fillet requires examination from the bottom of the device, which may require slight changes in a manufacturer's inspection process, if an inspection process is used.

Figure 4:
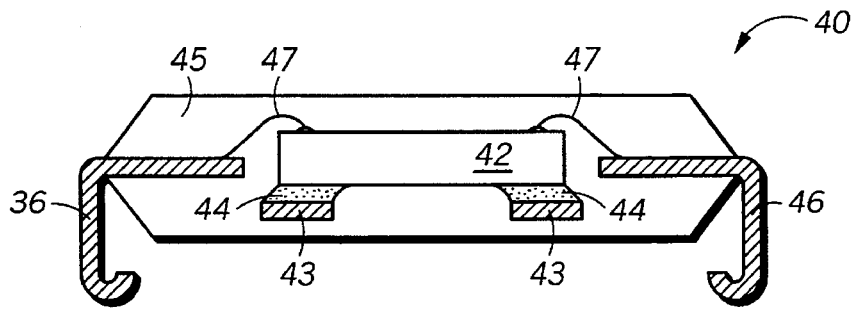
FIG. 4 is a cross-sectional view of another assembled semiconductor device in accordance with the present invention.

In embodiments of the present invention in which the die does not completely overhang the tie bars, as in FIG. 2, one fillet should form around the perimeter of the die where the tie bar extends beyond the die. Another inverted fillet should form along the perimeter of the tie bar where the die overhangs the tie bars. The two different fillets are illustrated in a cross-sectional view of a semiconductor device 40 in FIG. 4. Device 40 includes a semiconductor die 42 bonded to a forked tie bar 43 using a die attach adhesive 44. The device is encapsulated in a plastic package 45, and the die is electrically coupled to a plurality of leads 46 by wire bonds 47. Leads 46 are as illustrated in a J-lead configuration, although through-hole and gull-wing configurations may be used.

Although various die sizes can be used with the same lead frame design in devices in accordance with the present invention, there are limits to the die size employed. For instance, limits to the die size and shape of die 22 and 24 of FIGS. 1 and 2 respectively are imposed by inner portions of leads 16 which define a die receiving area. Another limitation to the die size used with lead frame 12 may be wire bond length. As the die size becomes smaller, the length of wire bonds 28 needed to electrically couple the die to leads 16 increases. Thus, a manufacturer's upper limit on wire bond length will also set a lower limit on die size.

Since a flag is not employed, it may be necessary to modify existing assembly procedures in making a device in accordance with the present invention. For instance, as noted in the discussion above, a dispense pattern for a die attach adhesive is limited to a small tie bar area rather than to the area of an entire flag. Therefore, tooling modifications for adhesive dispense heads and dispense patterns may be necessary. Also, a smaller amount of die attach adhesive is needed with the present invention since the die support area (the tie bars) is smaller than a conventional flag. In addition, tighter process control for die attach dispense may be needed. Since the die overhangs the tie bars either entirely, or at least partially, it is possible for the adhesive to spread beyond the tie bars when attaching a semiconductor die, thereby contaminating an underlying tooling platform. Thus, the upper limit on the amount of adhesive should be tightly monitored. At the same time, however, it is important that enough adhesive be dispensed to provide the proper fillet, as discussed above.

Another processing modification may be useful during wire bonding. Since a semiconductor die is not fully supported along the die periphery, it may be advantageous to provide peripheral die support during wire bonding. Bond pads are generally, but not always, located around the periphery of the die. Thus, to bond a wire to each bond pad a wire bonding tool must exert pressure on the die perimeter each time it forms a bond. If the wire bonding force is high enough, or alternatively if the die is not flexible enough, there is a risk that the force exerted will cause an unsupported portion of the die to crack or chip. Therefore, it may be desirable to incorporate a support mechanism into the wire bonding platform. For instance, the platform may be designed to include a cut-out which matches the pattern and thickness of the cantilevered tie bars so together the platform and tie bars form a substantially planar and continuous surface. As a result the entire die would be supported by a combination of the tie bars and platform during the wire bonding operation. It is important to note that modifications to existing wire bonding operations may not be needed in practicing the present invention. The need for modifications will depend on various factors, including bonding force, die thickness, die size, and bond pad location to name a few.

Figure 5:
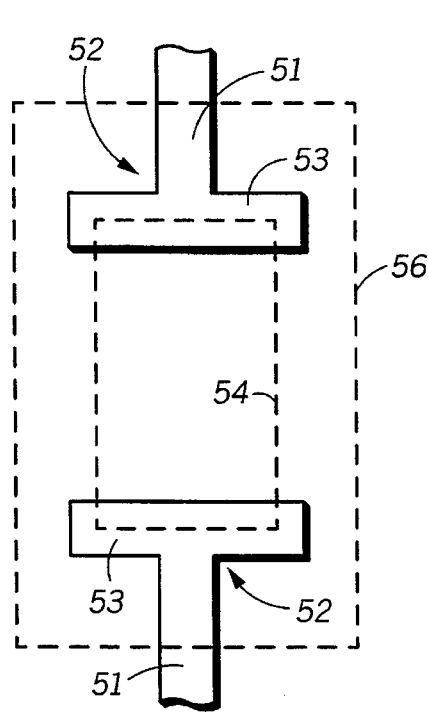
FIG. 5 is a top-down partial view of a lead frame illustrating an alternative tie bar design suitable for use in the present invention.
Figure 6:
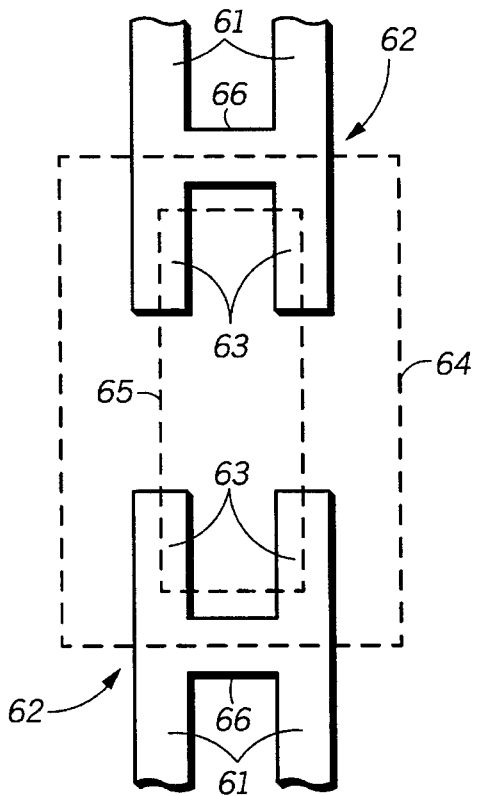
FIG. 6 is a top-down partial view of a lead frame illustrating yet another tie bar design suitable for use in the present invention.

Tie bars 18 of FIGS. 1 and 2 are forked such that inner ends of each tie bar are U-shaped. However, other cantilevered tie bar configurations can be implemented in accordance with the present invention. Two such alternative configurations are illustrated in FIGS. 5 and 6, both of which are top-down illustrations of only a portion of a semiconductor device, namely the tie bar portions. As illustrated in FIG. 5, two cantilevered tie bars 52 are T-shaped at inner ends. The outer ends of the tie bars extend to rails of a lead frame (not shown) as in previously illustrated embodiments. Like previous embodiments of the invention, the total metal surface area is reduced to help prohibit delamination once the tie bars are encapsulated in plastic. The T-shaped tie bars are also universal since various die sizes can be accommodated, as indicated by dashed lines 54 and 56 which represent die. Line 54 demonstrates that two entire sides, namely the "short" sides, of a semiconductor die can be supported, which may be beneficial for wire bonding purposes. However, in memory devices in particular, usually the "long" sides of a semiconductor die have associated bond pads. To support the long sides of a semiconductor die in accordance with the present invention, cantilevered tie bars can be interspersed with the leads, For example in the perspective of FIGS. 1 and 2, tie bars can be formed among and parallel to the leads, thereby extending under a semiconductor die from the left and right rather than from the top and bottom as illustrated.

Yet another tie bar configuration within the scope of the present invention is illustrated in FIG. 6. Two cantilevered tie bars 62 are each H-shaped. Inner ends of the tie bars extend beneath a larger semiconductor die, represented in phantom as dashed line 64, or alternatively beneath a smaller semiconductor die, represented in phantom as dashed line 65. Outer ends of the tie bars extend to rails of a lead frame (not illustrated). As illustrated by line 64, a semiconductor die is aligned with, and supported by, a central portion 66 of the H-shaped tie bars. However, this is not required with this tie bar configuration. Like in other configurations illustrated, various semiconductor die sizes can be used.

In yet other embodiments of the present invention, the "forked" tie bar configurations previously described could be modified to increase rigidity of the tie bars. For example, in the U-shaped and H-shaped configurations, the freestanding ends of each tie bar could be joined together by an additional segment to prevent or restrict independent movement of each end in a Z-axis (vertical) direction, or in other words to maintain planarity of the tie bar. Such an additional segment could be made straight or could be rounded to reduce stress build-up within an encapsulated device.

The foregoing description and illustrations contained herein demonstrate many of the advantages associated with the present invention. In particular, it has been reveealed that cantilevered tie bars can be used to support a semiconductor die to decrease the total plastic-metal interface within a plastic encapsulated device. Consequences of the reduced plastic metal interface are a reduction in the chances of internal delamination at the interface, thereby lessening the chances for package cracking. Moreover, the fact that the cantilevered tie bars are physically separated from one another decreases any delamination area which might occur. If a delamination develops at the interface of one tie bar and an encapsulating plastic, the delaminated area will not propagate to the other tie bar. In other words, delamination at each of the two tie bars occurs independently of the other. An additional benefit of the present invention is that the use of cantilevered tie bars enables a variety of die sizes to be supported by the tie bars. Yet another advantages is that the present invention can be implemented with no increase in piece-part costs. A lead frame used in accordance with the present invention can be manufactured at the same price as existing lead frames, or at a lower price due to higher volumes. Other manufacturing cost increases associated with optional tooling modifications is minimal.

Thus it is apparent that there has been provided, in accordance with the invention, a flagless semiconductor device and method for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not specifically limited to U-shaped, T-shaped, and H-shaped tie bar configurations. In addition, the invention is not limited to any particular package configuration. It is also important to note that tie bars of a device in accordance with the present invention may be down-set with respect to leads of the device to position the die at a desired level or height within the device, as indicated in FIG. 3. In addition, tie bars of a device in accordance with the present invention may include alignment features to aid in the alignment of a semiconductor die during die bonding. In addition, it is noted that the present invention is not limited in any way to the type of semiconductor die used within the device. While it is likely that devices which employ memory die will reap much benefit from the present invention, other die types (such as micro-controllers, analog devices, etc.) may certainly be used. Therefore, it is intended that this invention encompass all such variations and modifications as fall within the scope of the appended claims.

We claim:

1. A flagless semiconductor device comprising:
   a leadframe comprising:
   a plurality of leads having inner lead portions and outer lead portions, wherein the inner lead portions define a die receiving area having two opposing sides;
   two tie bars, and only two tie bars, extending into the die receiving area from the two opposing sides of the die receiving area without extending beyond one another, the two tie bars remaining physically separated and each having a single, straight stem portion which terminates into a forked support portion within the die receiving area, wherein the support portion has two branches which are symmetric with respect to the stem;
   a semiconductor die having a central portion, the semiconductor die being attached to the support portions of the two tie bars such that the central portion is substantially unsupported by the two tie bars and such that the semiconductor die overhangs the forked support portions of the two tie bars;
   means for electrically coupling the semiconductor die to the inner portions of the leads; and
   package body encapsulating the semiconductor die and the inner lead portions of the plurality of leads.

2. The semiconductor device of claim 1 wherein each forked support portion is substantially U-shaped.

3. The semiconductor device of claim 1 wherein the stem portion and support portion of each tie bar cooperate to form a T-shape.

4. The semiconductor device of claim 1 wherein the package body has four sides, and wherein outer lead portions of the plurality of leads extend outward from two opposing sides of the package body, and wherein the each of the two tie bars has an end which is flush with one of the remaining two sides as a result of being severed from the lead frame.

5. The semiconductor device of claim 1 wherein the semiconductor die has an area, and wherein the support portions of the two tie bars define a rectangular area within the die receiving area, such that the rectangular area is smaller than the area of the semiconductor die.

6. The semiconductor device of claim 1 wherein the stem portions of the two tie bars are substantially perpendicular to the outer lead portions of the plurality of leads.

7. A flagless semiconductor device comprising:
   a plurality of leads having inner lead portions and outer lead portions, wherein the inner lead portions together define a die receiving area having two first opposing sides and two second opposing sides, wherein the first opposing sides are each shorter than each of the second opposing sides;
   a tie bar extending into the die receiving area from each of the two first opposing sides, such that there are two tie bars and only two tie bars in the device, wherein each of the two tie bars has a stem portion and a support portion connected to the stem portion, the stem portion of each tie bar being substantially perpendicular to the outer lead portions of the plurality of leads and the support portion of each tie bar
   being forked where it connects to the stem portion and terminating within the die receiving area;
   a semiconductor die attached to and supported by the two tie bars such that the semiconductor die completely overhangs the support portion of each of the two tie bars and such that a center of the semiconductor die is unsupported by the two tie bars;
   means for electrically coupling the semiconductor die to the plurality of leads; and
   a plastic package body encapsulating the semiconductor die and inner lead portions of the plurality of leads.

8. The semiconductor device of claim 7 wherein the support portion of each tie bar is substantially U-shaped.

9. The semiconductor device of claim 7 wherein the semiconductor die also partially covers the stem portion of each of the two tie bars.

10. The semiconductor device of claim 7 wherein the tie bars are physically separated from each other and extend into the die receiving area without passing each other.

11. The semiconductor device of claim 7 wherein the semiconductor die has an area, and wherein the support portion of each of the two tie bars define a rectangular area within the die receiving area, such that the rectangular area is smaller than the area of the semiconductor die.

12. The semiconductor device of claim 7 wherein only two tie bars support the semiconductor die.

13. The semiconductor device of claim 7 wherein the support portion and stem portion of each tie bar cooperate to form a T-shape for supporting the semiconductor die.

14. A flagless semiconductor device comprising:
   a leadframe comprising:
   a plurality of leads having inner lead portions and outer lead portions, wherein the inner lead portions define a die receiving area having two opposing sides;
   two tie bars extending into the die receiving area from the two opposing sides of the die receiving area without extending beyond one another, the two tie bars remaining physically separated, wherein each tie bar has two substantially parallel stem portions and a connecting portion perpendicular to and connecting the two stem portions, and wherein the two stem portions and connecting portion of each tie bar cooperate to form an H-shape;

a semiconductor die mounted to the two tie bars;

means for electrically coupling the semiconductor die to the inner portions of the leads; and a package body encapsulating the semiconductor die and the inner lead portions of the plurality of leads.

15. The device of claim 14 wherein the semiconductor die is mounted to the two tie bars such that the connecting portions of the two tie bars are uncovered by the die.

16. The device of claim 14 wherein the semiconductor die is mounted to the two tie bars such that the connecting portions of the two tie bars are at least partially uncovered by the die.

17. The device of claim 14 wherein the two tie bars are physically separated from one another and are the only part of the leadframe supporting the die.

18. The device of claim 14 wherein the connecting portion divides the two stem portions of each tie bar into two proximal stem portions and two distal stem portions, wherein the proximal stem portions are closer to the die receiving area than the distal stem portions, and wherein the semiconductor die overhangs the proximal stem portions of each tie bar.

19. A flagless semiconductor device comprising:

a leadframe comprising:

a plurality of leads having inner lead portions and outer lead portions, wherein the inner lead portions define a die receiving area having two opposing sides;

two tie bars, and only two tie bars, extending into the die receiving area from the two opposing sides of the die receiving area without extending beyond one another, the two tie bars remaining physically separated and each having a single, straight stem portion which terminates into a forked support portion within the die receiving area, wherein the support portion has two branches which are symmetric with respect to the stem and wherein the stem portion and support portion of each tie bar cooperate to form a T-shape;

a semiconductor die having a central portion, the semiconductor die being attached to the support portions of the two tie bars such that the central portion is substantially unsupported by the two tie bars;

means for electrically coupling the semiconductor die to the inner portions of the leads; and a package body encapsulating the semiconductor die and the inner lead portions of the plurality of leads.

20. A flagless semiconductor device comprising:

a leadframe comprising:

a plurality of leads having inner lead portions and outer lead portions, wherein the inner lead portions define a die receiving area having two opposing sides;

two tie bars, and only two tie bars, extending into the die receiving area from the two opposing sides of the die receiving area without extending beyond one another, the two tie bars remaining physically separated and each having a single, straight stem portion which terminates into a forked support portion within the die receiving area, wherein the support portion has two brandies which are symmetric with respect to the stem and wherein the support portions of the two tie bars define a rectangular area within the die receiving area;

a semiconductor die having a central portion and an area larger than the rectangular area defined by the two tie bars, the semiconductor die being attached to the support portions of the two tie bars such that the central portion is substantially unsupported by the two tie bars;

means for electrically coupling the semiconductor die to the inner portions of the leads; and a package body encapsulating the semiconductor die and the inner lead portions of the plurality of leads.

21. The semiconductor device of claim 20 wherein the stem portion and support portion of each tie bar cooperate to form a T-shape.

22. The semiconductor device of claim 20 wherein each forked support portion is substantially U-shaped.

* * * * *